United States Patent
Wee et al.

(10) Patent No.: US 6,383,303 B1
(45) Date of Patent: May 7, 2002

(54) HIGH VOLUME FLUID HEAD

(75) Inventors: Hwee Nam Wee, Singapore (SG); Peter Hock Ming Ng, Johor (MY); Sean Shiao Shiong Chong, Singapore (SG)

(73) Assignee: St Assembly Test Services Pte Ltd, Singapore (SG)

( * ) Notice: Subject to any disclaimer, the term of this patent is extended or adjusted under 35 U.S.C. 154(b) by 0 days.

(21) Appl. No.: 09/467,114

(22) Filed: Dec. 20, 1999

(51) Int. Cl.[7] .................................................. C23G 1/00
(52) U.S. Cl. ...................... 134/2; 134/6; 134/7; 134/9; 134/15; 134/25.1; 134/25.4; 134/26; 134/32; 134/36; 134/42; 134/67; 134/72; 134/131; 451/38; 451/39; 451/75; 451/101; 451/102
(58) Field of Search ................................. 134/2, 6, 7, 9, 134/15, 25.1, 25.4, 26, 32, 34, 36, 42, 902, 67, 72, 131; 451/38, 39, 75, 101, 102

(56) References Cited

U.S. PATENT DOCUMENTS

| | | | |
|---|---|---|---|
| 4,327,756 A | 5/1982 | Rath | 134/72 |
| 5,103,846 A | 4/1992 | Clark et al. | 134/57 R |
| 5,197,673 A | 3/1993 | Sullivan | 239/102.1 |
| 5,240,018 A | 8/1993 | Clark et al. | 134/64 R |
| 5,378,307 A | 1/1995 | Bard et al. | 156/639 |
| 5,379,943 A * | 1/1995 | Gibson | 228/20.1 |
| 5,916,374 A | 6/1999 | Casey et al. | 134/37 |
| 5,928,432 A * | 7/1999 | Foederl et al. | 134/2 |
| 5,971,246 A * | 10/1999 | Au et al. | 228/1.1 |
| 6,132,523 A * | 10/2000 | Okuda et al. | 134/36 |
| 6,250,318 B1 * | 6/2001 | Kiat et al. | 134/72 |
| 6,282,812 B1 * | 9/2001 | Wee et al. | 34/464 |

* cited by examiner

Primary Examiner—Sharidan Carrillo
(74) Attorney, Agent, or Firm—George O. Saile; Stephen B. Ackerman

(57) ABSTRACT

An apparatus for spraying a liquid on the surface of assemblies that are moving through wash and rinse stations. The apparatus of the invention comprises a liquid box that contains a liquid supply vessel in addition to containing a liquid nozzle wherein a liquid supply vessel is connected to the liquid nozzle wherein the liquid nozzle contains a multiplicity of openings wherein the openings direct the liquid at the surface of assemblies that are moving through the wash and the rinse stations, the liquid supply vessel being a first sub-assembly of the liquid box wherein, the liquid nozzle being a second sub-assembly of the liquid box, the bottom surface of the first sub-assembly being mechanically connected to a top surface of the second sub-assembly, the connection forcing the liquid from the first sub-assembly into the second sub-assembly, assuring that no liquid escapes from an interface between the first and the sub-assembly other than through the multiplicity of openings in the second sub-assembly, wherein furthermore the cleaning liquid can exit the liquid vessel either gravity fed or under high pressure through the multiplicity of openings in the second sub-assembly.

12 Claims, 3 Drawing Sheets

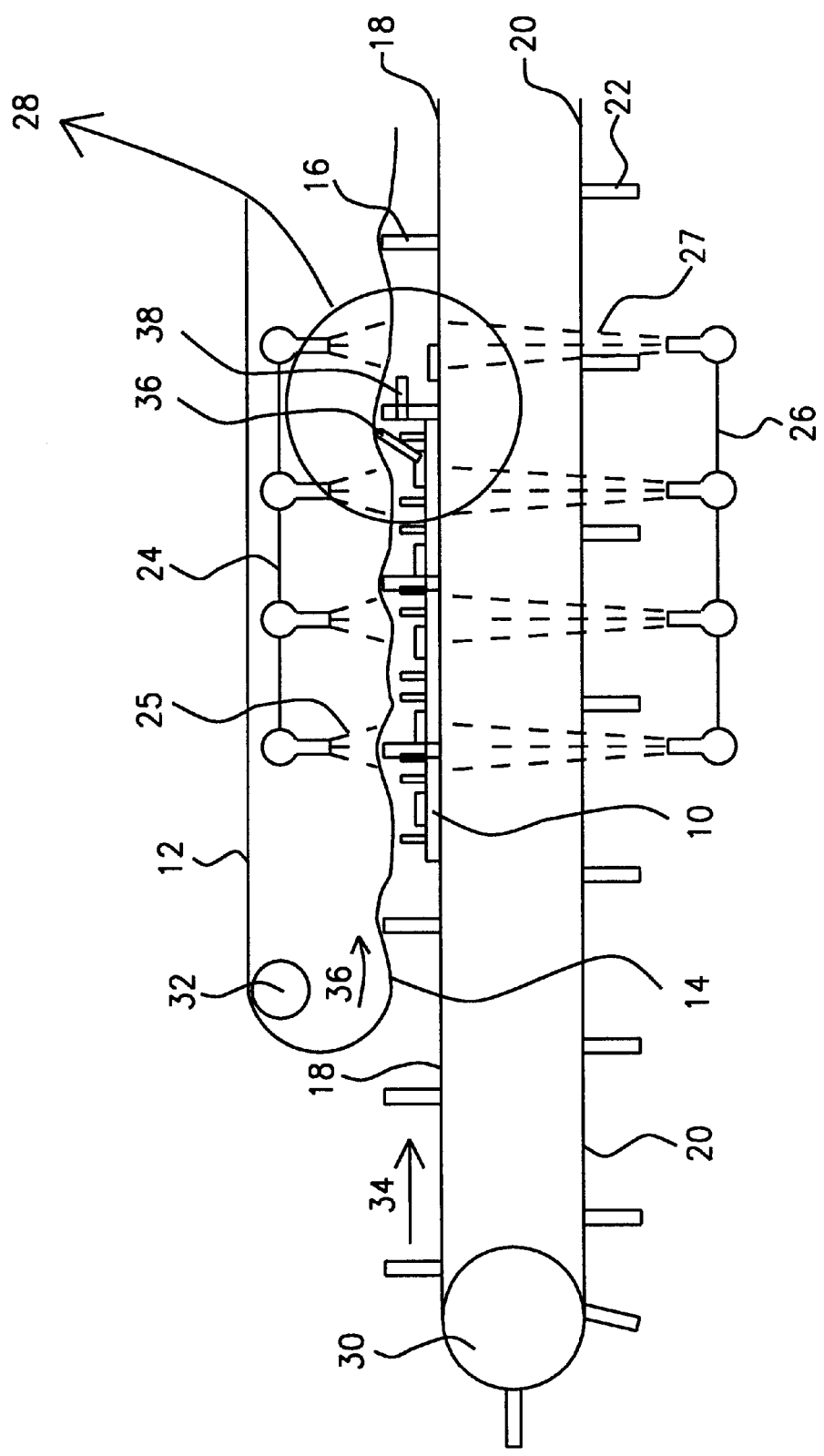
FIG. 1 – Prior Art

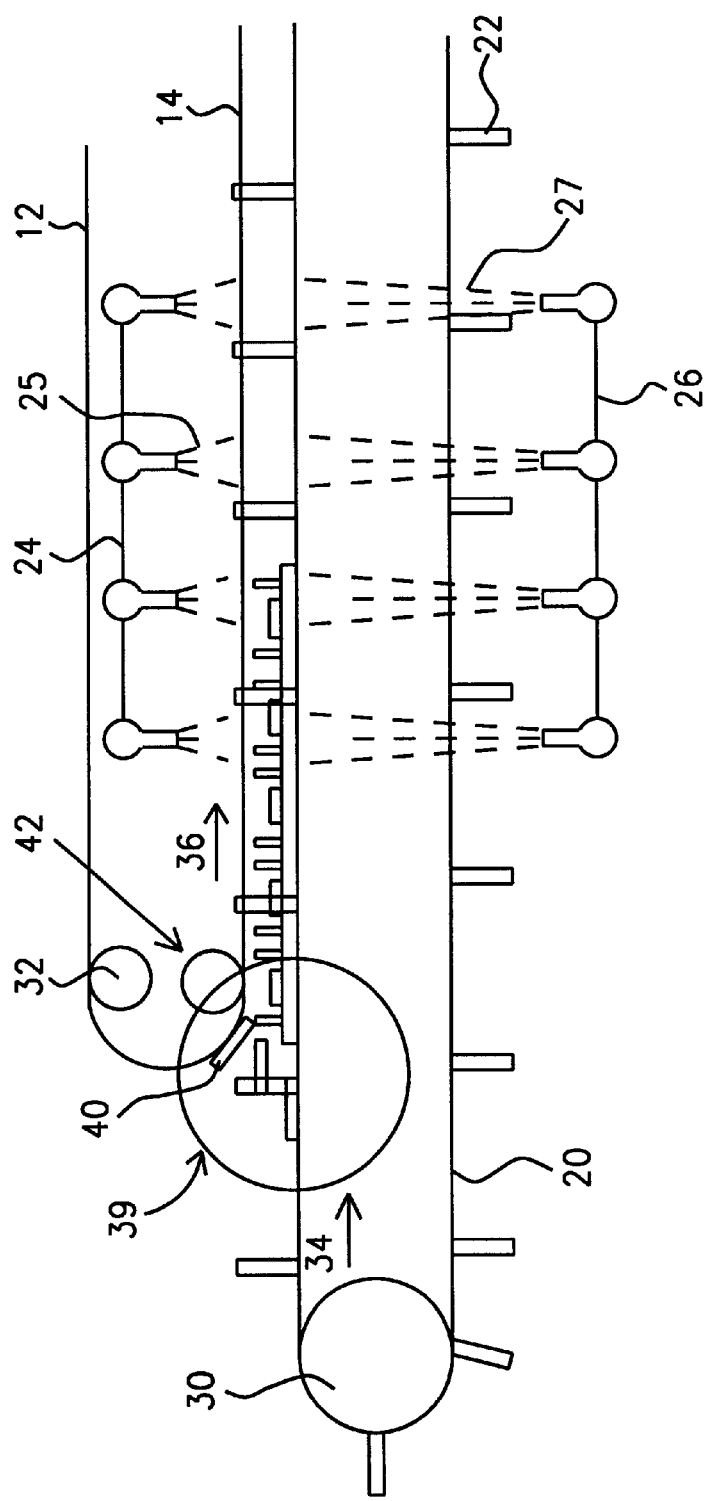
FIG. 2 – Prior Art

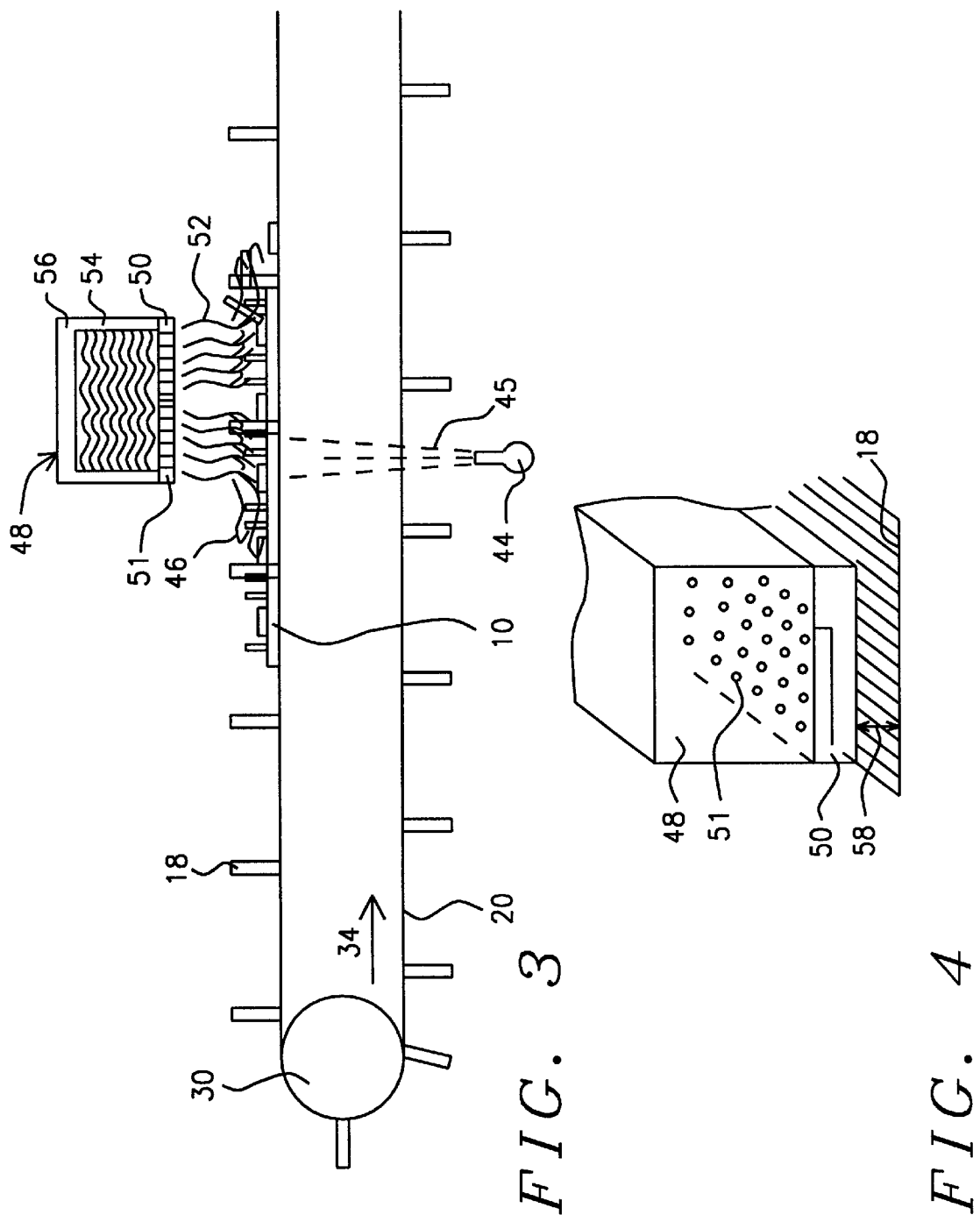

HIGH VOLUME FLUID HEAD

BACKGROUND OF THE INVENTION (1) Field of the Invention

The invention relates to the fabrication of integrated circuit devices and, more particularly, to an apparatus for increasing the flow of cleaning fluid while not disturbing the position of the cleaned object due to cleaning fluid impact.

(2) Description of the Prior Art

Improved semiconductor device performance has for many years now been pursued by decreasing device dimensions while at the same time increasing device density. Increased device density not only applies to decreased device feature size and to decreased separation between the interconnects between device features, increased device density is also frequently achieved by denser packaging of individual devices onto device carrier surfaces. One of the more commonly applied means to achieve denser device packaging is the Printed Circuit Board (PCB) or by mounting semiconductor devices on individual substrates. The preferred method for attaching semiconductor devices to PCB's or individual substrates is soldering whereby points of electrical contact of individual devices are mechanically and electrically connected to interconnect metal lines and/or bond pads that have been provided for this purpose on the surface of the PCB or the individual substrate.

To enhance the reliability and uniformity of the solder connection that is established in this manner, solder fluxes are first deposited on the surface of the substrate. These solder fluxes must be selected such that they introduce no negative impact on the surface of the substrate, they must for instance have low corrosion and must be of long life expectancy. Of great importance in this respect is also the selection of the medium that is used to clean the solder fluxes from the surface of the substrate and the reaction that these cleaning agents have with the solder flux during the process of cleaning the substrate. In the early stages of PCB or substrate manufacturing, chlorinated hydrocarbon and chlorofluorinated solvents were mostly used to removed rosin fluxes, these cleaning agents have however been replaced due to the toxic effect of chlorinated hydrocarbon and chlorofluorinated solvents and the consequent highly negative impact that the disposal of chlorinated hydrocarbon and chlorofluorinated solvents has on the environment. As alternatives to the chlorinated hydrocarbon and chlorofluorinated solvents terpene compounds have been used extensively in recent years whereby commercially available cleaning equipment is available that is mostly directed at a cleaning process that uses terpene compounds as the cleaning agent.

In the assembly of semiconductor devices, Printed Circuit Boards (PCB's) or individual substrates have been applied extensively and for many years. The substrates serve a number of functions in assembling semiconductor components such as providing mechanical support for a large structure, heat dissipation and the ability to significantly increase the input/output interconnect capability of an assembly. The use of packaging substrates has led to related technologies and has at the same time had a significant impact on the packaging of the individual chips that are mounted onto the substrates. Semiconductor dice can be attached to a substrates using Chip On Board (COB) techniques, these COB techniques include flip chip attachment, wirebonding, and tape automated bonding (TAB). Flip chip attachment techniques consist of attaching a flip chip to a PCB or to any other substrate. The flip chip method of packaging has been specifically designed to utilize and enhance the advantages that mounting on a substrate offers. A flip chip is a semiconductor chip that has a pattern or arrays of terminals spaced around an active surface of the flip chip for face down mounting of the flip chip to a substrate. A flip chip can be provided with a number of different contact point arrangements such as the Ball Grid Array (BGA), the Slightly Larger than Integrated Circuit Carrier (SLICC) and the Pin Grid Array (PGA). With the BGA, an array of minute solder balls is arranged on the surface of the flip chip, this array of solder balls attaches the flip chip to the substrate. The arrangement for the SLICC is similar to the BGA but the solder ball pitch and diameter of the contact balls is smaller than for the BGA. For the PGA, an array of small pins extends perpendicularly from the attachment surface of a flip chip, whereby the protruding pins align with a specific arrangement of metal interconnect lines on a printed circuit board or on another substrate for attachment. It is clear that, for the BGA and SLICC type of flip chip, the solder or other conductive ball arrangement on the flip chip must be a mirror image of the connecting bond pads on the printed circuit board in order to establish precise connections between the flip chip and the board. The flip chip is bonded to the printed circuit board by refluxing the solder balls. The solder balls may also be replaced with a conductive polymer. With the PGA, the pin arrangement of the flip chip must be a mirror image of the recesses on the printed circuit board. After insertion, soldering the pins into place generally bonds the flip chip. While in most cases the interconnect wiring that is provided on the printed board consists of a suitable metal, printed board wiring can also consist of polyimide, glass reinforced epoxy and ceramics.

After semiconductor devices have been attached to a substrate, the substrate is, as previously indicated, cleaned to remove any remaining residue from the surface of the board. This process typically involves washing of the substrate in a solvent that is selected such that residue on the surface of the board is dissolved in the solvent after which the solvent is removed from the cleaning apparatus. This however results in a solvent that may contain chemicals that are harmful to the environment, which requires special treatment of the solvent solution. One of the methods that are being used to prevent impurities in a solvent is to apply solid carbon dioxide ($CO_2$) particles to the surface that needs to be cleaned. These particles, upon striking the surface that needs to be cleaned, sublimate in the process of which residue on the surface of the board is absorbed and removed from that surface. The use of $CO_2$ however does result in the build-up of an electrostatic charge on the surface of the board that is being cleaned. This electrostatic charge must either be prevented from building up or must be removed before the board is passed on to further processing steps. The former can be accomplished by grounding the board while it is being treated by the $CO_2$, the latter can at least partially be accomplished by mixing the $CO_2$ with another substance, such as a water mist, that prevents or alleviates the accumulation of the electrostatic charge during the cleaning process.

Solvents that are used to clean printed circuit boards must meet a number of requirements that relate to both the effectiveness of the cleaning operation and to the toxic nature of the waste products that are produced during the cleaning operation. The by-products of the cleaning operation must not result in products that are contaminating, difficult to degrade, have a long retention period and have in any other way an undesirable impact on the environment where they are disposed. For these reasons, chlorinated hydrocarbon and chlorofluorinated solvents have largely been abandoned even though these substances have excellent qualities as solvents of rosin flux and other by-products of solder operations. In recent years, terpene compounds appeared to be an attractive alternative to the previous generation of solvents, this is because terpene compounds offer significant advantages for the cleaning operation. It is for instance known that terpene compounds are widely available and are safe enough that they have been used as a food additive. Terpene compounds are also readily biodegradable and can readily be handled be regular waste disposal facilities. Terpene compounds can be applied under room temperature, they are not volatile and have a boiling point that is considerably higher than halogenated solvents. Furthermore, terpene compounds can penetrate between densely mounted components and can therefore provide excellent cleaning of surfaces of high density. Where the indicated advantages of terpene compounds are considerable, terpene compounds however have the disadvantage that they are flammable under relatively low temperatures (100 to 200 degrees F.) and that they readily solidify when brought into contact with water. Terpene compounds further have a profoundly objectionable odor while terpene compounds, because they are not volatile, must be rinsed away after application. This process of rinsing however can readily result in the gelling of the terpene compounds, which makes the process of removal of the terpene compounds cumbersome.

One of the more frequently used type of apparatus for cleaning printed circuit board using terpene compounds is manufactured by the Vitronics Corporation of Newmarket, N.H. U.S. Pat. Nos. 5,103,846 and 5,240,018 detail such an apparatus as marketed by the Vitronics Corporation. The apparatus of invention U.S. Pat. Nos. 5,103,846 and 5,240,018 includes three different components, a first housing that contains the terpene washing apparatus, a second housing that contains a water rinsing apparatus and an intermediate conveying means for transporting the devices from the first housing to the second housing. The intermediate conveying means is positioned at an angle such the end facing the second housing is positioned lower than the first end. Exhaust fans are provided for the first housing to prevent escape or terpene odors or vapors, similar fans in the second housing prevent the escape of water vapor. Scrubbers are provided in the exhaust ducts from the first housing that prevent terpene compounds from escaping into the atmosphere. A flame detector is provided that prevent the introduction of boards that have either an open flame on the surface or that are of too high a temperature. The temperature of the terpene vapor is controlled by a series of temperature controls to prevent the terpene vapors from igniting.

The current aqueous cleaning and drying cycle for the Vitronics cleaner uses five high-pressure nozzles for cleaning the flip chip assemblies. Of the five high-pressure nozzles, three are top high-pressure nozzles and two are bottom high-pressure nozzles. The flip chip assemblies that are cleaned using this apparatus can be singulated semiconductor devices or they can be strip mounted, multiple devices. During the cleaning process, the Vitronics cleaner has a hold-down belt that keeps the parts that are being cleaned in a downward position. High pressure spraying (of the cleaning agent) is applied to the parts that are being cleaned, this high pressure spraying can result in individual devices being lifted up from the carrier or belt on which they are transported. In addition, devices that are mounted on strips can be dragged due to the high-pressure flow that causes the solder balls to be dented during the clean operation. The invention provides a method of mass fluid-transfer that flows over a wide area of the component that is being cleaned while the fluid at the same time exerts downward pressure on the parts that are being cleaned. The apparatus of the invention therefore assures that individual parts are cleaned properly while the flow of these parts through the rinse and wash station is not negatively effected by high-pressure application of cleaning agent.

Referring now to FIG. 1, there is shown a cross section of a wash and rinse station of the Prior Art that demonstrates components being dislodged from their position. A unit 10 of an electrical assembly, typically a subassembly to which a number of electrical components such as semiconductor devices, capacitors, filters and the like have been attached, is passed through the wash and rinse station of the cross section. The main belt 18 of the station is provided with rotating motion 34 by means of the motor 30, the component 10 that is being washed and rinsed is positioned on top of belt 18. Supports 22 are provided to essentially separate belt 18 from belt 14. Belt 14 is driven in direction 36 by motor 32 so that both belts 14 and 18 move in the same forward direction as the assembly 10. Belt 18 is the bottom belt of the station, belt 14 is the top belt of the station. Belt section 20 is the return trajectory of belt 18 while belt section 12 is the return trajectory of belt 14. While assembly 10 is positioned between belts 14 and 18 the assembly undergoes the process of washing and rinsing. The assembly 10 is, as part of the wash and rinse sequence, sprayed with a rinsing compound (25 and 27) by the high pressure nozzles 24 and 26 that are mounted respectively above and below the component 10 as it passes through the station. Nozzles 24 and 26 create the high-pressure flows 25 and 27 of a wash and rinsing compound. This high-pressure flow strikes the components that are mounted on the assembly 10 with considerable force thereby potentially dislodging these components from the assembly 10. It must be noted that the prior art station that is shown in cross section on FIG. 1 uses two belts for the transport of the assembly 10. The top belt 12 is not under tension in section 14 of the belt where the belt passes over or is close to passing over assembly 10. The cutout 28 indicates that, within the final section of the passage of assembly 10 through the station, components 36 and 38 have been dislodged thereby having a serious negative yield impact on the process of washing and rinsing the assembly 10.

FIG. 2 shows a cross section of a wash and rinse station that has been equipped with hold-down rollers 42. These rollers 42 have been provided to assure that the assembly 10 remains in place while it passes through the wash and rinse station. It is however clear from FIG. 2 that, at the point 39 where the assembly enters between the belts 14 and 18, the distance between these two belts is fixed. The purpose of belt 14 is, as stated, to hold the assembly 10 in place. This means that pressure is exerted by belt 14 onto assembly 10 at the time the assembly 10 enters in between the two belts on its way through the station, that is location 39. This pressure frequently results in too much pressure being exerted in order to "force" the assembly into place. Also, any misalignment between the assembly 10 and its ideal position between the belts 14 and 18 will be corrected at the time that the assembly enters between the two belts. This correction is again very prone to misalignment, which causes random forces to be exerted on the assembly 10. These random forces are transmitted through the assembly 10 to the contact balls (not shown) that are used to attach components to the assembly 10. As a consequence, the contact balls are frequently damaged, which is a serious yield detractor to the process of washing and rinsing the assembly 10. At the time that the assembly 10 enters between the two belts 14 and 18, components that are not in exact alignment will carry the brunt of the forces that are exerted to wedge the assembly 10 between the two belts. This results in a high probability that these components will be bent or even dislodged, further adding to the yield detractor of the wash and rinse station.

U.S. Pat. No. 5,103,846 (Clark et al.) —assigned to Vitronics—teaches cleaning tool having fluid nozzles above the part. This is close to the invention. Clark does not appear to use a hold down belt.

U.S. Pat. No. 5,916,374 (Casey et al.) shows a mask cleaner with fluid nozzles on both sides of the mask being cleaned.

U.S. Pat. No. 4,327,756 (Rath) shows a cleaning machine having a hold down belt and fluid spray nozzles 54 above and below the parts.

U.S. Pat. No. 5,240,018 (Clark et al.) (assigned to Vitronics) shows a cleaning tool having spray nozzles above and below the parts. See FIG. 3.

U.S. Pat. No. 5,378,307 (Bard et al.) shows a fluid treatment apparatus that has spray nozzles on both sides of a part U.S. Pat. No. 5,197,673 (Sullivan) Assigned to Vitronics corp—shows a nozzle assembly with nozzles above and below the parts.

SUMMARY OF THE INVENTION

A principle objective of the invention is to provide an apparatus for cleaning electronic components whereby these components can be sprayed with a cleaning agent using mass fluid transfer whereby the flow of the components through the cleaning apparatus is not impacted by the flow of the cleaning agent.

Another objective of the invention is to provide an apparatus for cleaning electronic components whereby the method of delivery of the cleaning agent holds the components firmly in place during the process of cleaning.

Another objective of the invention is to provide an apparatus for cleaning electronic components whereby the cleaning agent is distributed over a wide angle during the process of cleaning.

In accordance with the objectives of the invention a new apparatus is provided for delivering cleaning agent to an apparatus for cleaning electrical components that are typically used in the semiconductor industry. The invention teaches an apparatus for the mass delivery of cleaning agent to the component that is being cleaned while this cleaning agent at the same time is delivered over a wide angle thereby covering an extensive area of the component that is being cleaned. At the same time, the angle under which the cleaning agent is delivered is such that the cleaning agent provides added pressure for the component that is being cleaned to remain in the position under which this component has entered the cleaning chamber, this during the entire process of cleaning.

BRIEF DESCRIPTION OF THE DRAWINGS

FIG. 1 shows a cross section of a wash and rinse station of the Prior Art that demonstrates components being dislodged from their position.

FIG. 2 shows a cross section of a wash and rinse station of the Prior Art that demonstrates solder balls being dented while in the wash and rinse station.

FIG. 3 shows a cross section of the wash and rinse station of the invention that demonstrates the introduction of cleaning fluid into the wash and rinse station.

FIG. 4 shows an expanded three-dimensional view of the fluid box design of the invention.

DESCRIPTION OF THE PREFERRED EMBODIMENTS

A typical BGA package is cleaned during the final manufacturing stages using a water-soluble flux whereby cleaning procedures are used that are equally applicable to PCB cleaning. The apparatus of the invention addresses problems that have been encountered following these procedures. The apparatus of the invention provides a new high volume fluid box that allows for the effective and damage free cleaning of small electronic assemblies.

During the process of BGA ball reflow and attach, flux is used for the cleaning of the oxide from the solder balls and the surface of the ball pad. The flux that is used is prone to introduce ionic contamination of the packaged components, which can have a serious detrimental effect on product yield and is therefore a serious concern. In addition, additives that are frequently made part of the flux are often difficult to remove. Water-soluble flux is therefore the preferred medium in cleaning electronic assemblies. The key requirement for the cleaning process is that the flux is completely removed from the assemblies and from the solder balls and from the substrate on which the components are mounted. The invention addresses the design of a high volume fluid box that is used for the cleaning of electronic assemblies.

BGA assemblies are typically processed in one of two forms, that is in strip form (containing multiple BGA packages) or as singulated units (containing only one BGA package). When BGA assemblies are processed in singulated form, a carrier belt is used to transport the singulated units through the aqueous cleaning system.

The problems that are typically experienced during high-pressure cleaning of electronic assemblies can be summarized as follows:

high pressure nozzle spraying results in the singulated units being lifted from the transporting carrier a hold-down belt that is in place above the processed BGA assemblies exerts excessive pressure on the assemblies resulting in damage to the balls of the units the angle under which the cleaning agent strikes the BGA assemblies is such that certain parts of the assemblies, such as around the balls of the assemblies, are not reached and are therefore not cleaned to satisfaction the hold-down belt interferes with the spray that is directed at the assemblies that are being cleaned thereby preventing complete cleaning of the assemblies, and the combination of transport belt and hold-down belt frequently interferes with linear and orderly transport of the assembly with the result that the assembly is dragged along the transport belt resulting in scratching of the assembly or other damage to the assembly. Identification markings that have been applied to the surface of the assembly are in this manner frequently made illegible.

FIG. 3 shows a cross section of the wash and rinse station of the invention. The high pressure, relatively large-scale pressure nozzles of conventional design have been replaced with a fluid box 48. It must immediately be noted that, where the high pressure nozzles of conventional design aim the fluid under a concentrated stream and thereby exert pressure on the surface of the assembly 10 in a very localized manner, the fluid box 48 of the invention spreads the delivery of the fluid over a wide area, that is the exhaust nozzle 50 of the fluid box that faces the assembly 10. The wash and cleaning fluid exits the exhaust area via a multiplicity of small openings 51 that are provided for this purpose in the exhaust nozzle 50. The pressure that is therefore exerted on the surface of the assembly 10 is distributed over a wide area and does not exert a localized, high force on any part of the surface of assembly 10 or on any of the components that are mounted on that surface. One of the major reasons for component damage or dislodgment has therefore been eliminated. Also, since the discharge region 50 of the fluid box is relatively large, the apparatus of the invention can discharge large quantities of fluid over the surface of the assembly 10. Where the flow of fluid that exits the fluid box 48 needs to be increased, the pressure under which the fluid is released can be increased. This increase in pressure however will not result in increasing the pressure on narrow areas on the surface of the assembly 10 since the increased pressure will result in increased spray that will exit the fluid box 48 as a mist and not as a massive flow that can damage the surface of the assembly 10. It must further be noted that the apparatus of the invention has eliminated the need for the top belt of the conventional station. The top belt of the conventional station is partially required to keep the assembly 10 in place while it passes between the two belts of conventional cleaning due to the high pressure that is exerted on the assembly by the high pressure fluid flow (25 and 27, FIGS. 1 and 2). Since, under the apparatus of the invention, the high pressure nozzles that are likely to dislodge components from the assembly 10 or to dislodge the assembly itself have been eliminated, the constraint that has under conventional stations been provided by the top belt is no longer required. By eliminating the top belt, another cause for assembly damage has been eliminated in that the assembly or components that are contained within the assembly no longer need to be pressured in entering the space between the top and the bottom belt of conventional design. The item that has been marked as 54 is the fluid container of the fluid box of the invention, item 56 is the fluid retainer that functions not only to make up a main portion of the fluid box of the invention but also to assure that no fluid escapes from the fluid box around the periphery of the exhaust nozzle 50. Fluid pumps and other structural details of the fluid box 48 have been omitted from FIG. 3 in order to highlight only the details of the apparatus of the invention that are germane to the invention.

FIG. 4 shows an expanded three-dimensional view of the fluid box of the invention. Item 48 forms the main body of the fluid box, the discharge region 50 contains a multiplicity of openings 51 through which the cleaning fluid is discharged onto the surface of the assembly 10 (not shown) that is transported by the belt 18. Typical opening dimensions are a diameter of about 1.2 mm and a depth of about 20 mm, hole pitch is about 5 mm. The spray height 58 is kept to a minimum thereby assuring that the parts that are contained within the assembly 10 are firmly pressed against the belt 18. The hole pattern that is shown in FIG. 4 assures that the spray that is broadcast by the fluid box 48 covers the entire area of the belt 18.

The liquid supply vessel being a first sub-assembly of the liquid box wherein, the liquid nozzle being a second sub-assembly of the liquid box, the bottom surface of the first sub-assembly being mechanically connected to a top surface of the second sub-assembly, the connection forcing the liquid from the first sub-assembly into the second sub-assembly, assuring that no liquid escapes from an interface between the first and the sub-assembly other than through the multiplicity of openings in the second sub-assembly, wherein furthermore the cleaning liquid can exit the liquid vessel either gravity fed or under high pressure through the multiplicity of openings in the second sub-assembly.

The multiplicity of openings in the liquid nozzle are openings that are essentially perpendicular to the direction in which the assemblies move through the washing and rinsing station wherein the openings have a diameter of between about 0.8 and 1.6 mm and a pitch of between about 4 and 6 mm and a depth that protrudes through the liquid nozzle of between about 17 and 23 mm.

The liquid nozzle has a height in the direction that is perpendicular to the direction in which the assemblies move through the washing and rinsing station of between about 17 and 23 mm.

The liquid contains terpene compounds, halogenated solvents or chlorinated hydrocarbons.

In sum, the apparatus of the invention eliminates the yield detractors of:
  damaged or dislodged components due to concentrated impact of cleaning fluid on the surface of the assembly that is being washed and rinsed
  damaged or dislodged components due to pressing the assembly between two belts, belts that under conventional design are required to counteract the concentrated impact of cleaning fluid on the surface of the assembly, and
  dented solder balls due to pressing the assembly between two belts.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An apparatus for spraying a cleaning liquid on surfaces of electrical assemblies that are moving through wash and rinse stations, said apparatus comprises:
  a liquid box containing a liquid supply vessel and a liquid nozzle, said liquid supply vessel containing a cleaning and being connected to said liquid nozzle and said liquid nozzle containing a multiplicity of openings, wherein said openings direct said cleaning liquid at said surfaces of said electrical assemblies that are moving through said wash and said rinse stations, said liquid supply vessel being a first sub-assembly of said liquid box and said liquid nozzle being a second sub-assembly of said liquid box, said first sub-assembly having a bottom surface and said second sub-assembly having a top surface such that said bottom surface of said first sub-assembly is mechanically connected to the top surface of said second sub-assembly, said connection forcing the cleaning liquid from said first sub-assembly into said second sub-assembly, assuring that no cleaning liquid escapes from an interface between said first and said sub-assembly other than through said multiplicity of openings in said second sub-assembly, wherein said cleaning liquid exits said liquid supply vessel either gravity fed or under pressure through said multiplicity of openings in said second sub-assembly.

2. The apparatus of claim 1 wherein said multiplicity of openings in said liquid nozzle are openings that are perpendicular to the direction in which said electrical assemblies move through said wash and rinse stations, said openings having a diameter of between about 0.8 and 1.6 mm and a pitch of between about 4 and 6 mm and a depth that protrudes through said liquid nozzle of between about 17 and 23 mm.

3. The apparatus of claim 1 wherein said liquid nozzle has a height in the direction that is perpendicular to the direction in which said electrical assemblies move through said wash and rinse stations of between about 17 and 23 mm.

4. The apparatus of claim 1 wherein said cleaning liquid contains terpene compounds.

5. The apparatus of claim 1 wherein said cleaning liquid contains chlorinated hydrocarbons.

6. The apparatus of claim 1 wherein said cleaning liquid contains halogenated solvents.

7. A method for cleaning surfaces of electrical assemblies that are moving through wash and rinse stations, comprising the steps of:

(a) providing a liquid box containing a liquid supply vessel and a liquid nozzle said liquid supply vessel containing a cleaning and being connected to said liquid nozzle and said liquid nozzle containing a multiplicity of openings, wherein said openings direct said cleaning liquid at said surfaces of said electrical assemblies that are moving through a wash and rinse station, said liquid supply vessel being a first sub-assembly of said liquid box and said liquid nozzle being a second sub-assembly of said liquid box, said first assembly having a bottom surface and said second sub-assembly having a top surface such that said bottom surface of said first sub-assembly is mechanically connected to said top surface of said second sub-assembly, said connection forcing the cleaning liquid from said first sub-assembly into said second sub-assembly thereby assuring that no cleaning liquid escapes from an interface between said first and said sub-assembly other than through said multiplicity of openings in said second sub-assembly;

(b) directing said cleaning liquid from said first sub-assembly into said second sub-assembly; and (c) cleaning said surfaces of said electrical assemblies that are moving through a wash and rinse station, by spraying said surfaces with said cleaning liquid exiting from the multiplicity of openings in said second sub-assembly.

8. The method of claim 7, wherein said multiplicity of openings in said liquid nozzle are openings that are perpendicular to the direction in which said electrical assemblies move through said wash and rinse stations, said openings having a diameter of between about 0.8 and 1.6 mm and a pitch of between about 4 and 6 mm and a depth protruding through said liquid nozzle of between about 17 and 23 mm.

9. The method of claim 7 wherein said liquid nozzle has a height in the direction that is perpendicular to the direction in which said electrical assemblies move through said wash and rinse stations of between about 17 and 23 mm.

10. The method of claim 7 wherein said cleaning liquid contains terpene compounds.

11. The method of claim 7 wherein said cleaning liquid contains chlorinated hydrocarbons.

12. The method of claim 7 wherein said cleaning liquid contains halogenated solvents.

* * * * *